US006627588B1

(12) United States Patent
Hess et al.

(10) Patent No.: US 6,627,588 B1
(45) Date of Patent: Sep. 30, 2003

(54) METHOD OF STRIPPING PHOTORESIST USING ALCOHOLS

(75) Inventors: Dennis W. Hess, Atlanta, GA (US); Tazrien Kamal, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 0 days.

(21) Appl. No.: 09/522,892

(22) Filed: Mar. 10, 2000

Related U.S. Application Data

(60) Provisional application No. 60/123,824, filed on Mar. 11, 1999, and provisional application No. 60/173,070, filed on Dec. 24, 1999.

(51) Int. Cl.[7] .............................. C11D 3/43; C11D 3/04; B08B 7/00
(52) U.S. Cl. .................. 510/176; 510/175; 510/177; 510/438
(58) Field of Search ............................. 134/38, 40, 7; 510/175, 176, 438, 434, 180; 508/555

(56) References Cited

U.S. PATENT DOCUMENTS

| 4,202,703 A | * | 5/1980 | Zuber et al. |
| 4,213,873 A | * | 7/1980 | Church |
| 4,780,176 A | | 10/1988 | Sudarshan et al. ............ 156/643 |
| 4,917,123 A | | 4/1990 | McConnell et al. ............ 134/95 |
| 4,952,248 A | * | 8/1990 | Aberg |
| 4,975,147 A | | 12/1990 | Tahara et al. ............ 156/646 |
| 5,185,235 A | * | 2/1993 | Sato et al. |
| 5,262,001 A | | 11/1993 | Takehara ............ 156/643 |
| 5,380,397 A | | 1/1995 | Fukuyama et al. ............ 156/643 |
| 5,389,278 A | * | 2/1995 | Minn et al. |
| 5,468,686 A | | 11/1995 | Kawamoto ............ 437/229 |
| 5,626,775 A | | 5/1997 | Roberts et al. ............ 216/67 |
| 5,928,969 A | * | 7/1999 | Li et al. |

OTHER PUBLICATIONS

RD302099A Jun. 1989 RD Anonymous.*
Ojina et al., Journal of Electrochemical Society, vol. 44, 1977, p. 4005.
Bakker & Hess, Rev. Sci. Instrum. 68(1) Jan. 1997.
Kashkoush et al., Materials Research Society Symposium Proceedings vol. 477, 1997, p 173.
Chemical Process Safety: Fundamentals with Application Prentice Hall, 1990, pp. 42–44.

* cited by examiner

Primary Examiner—Gregory E. Webb
(74) Attorney, Agent, or Firm—Thomas, Kayden, Horstemeyer & Risley, LLP

(57) ABSTRACT

A liquid cleaning composition and method for removal of photoresist including an aliphatic alcohol. Preferably, the alcohol is isopropyl alcohol. Additionally, an alcohol/base mixture can be used to remove photoresist, rather than alcohol used alone. Preferably, the alcohol is isopropyl alcohol, while the aqueous base is ammonium hydroxide. The temperature conditions range from about 25 degrees C. to about 70 degrees C. The pressure conditions range from about 14 pounds per square inch to about 100 pounds per square inch.

45 Claims, 3 Drawing Sheets

METHOD OF STRIPPING PHOTORESIST USING ALCOHOLS

CLAIM OF PRIORITY

This application claims priority to copending U.S. provisional application entitled, "A NOVEL METHOD OF STRIPPING PHOTORESIST USING ALCOHOLS," having ser. No. 60/123,824, filed Mar. 11, 1999 and "PHOTORESIST STRIPPING WITH ALCOHOL/AQUEOUS BASE SOLUTIONS," having serial No. 60/173,070, filed Dec. 24, 1999, both of which are entirely incorporated herein by reference.

STATEMENT REGARDING FEDERALLY SPONSORED RESEARCH OR DEVELOPMENT

The U.S. government has a paid-up license in this invention and the right in limited circumstances to require the patent owner to license others on reasonable terms as provided for by the terms of NSF-BES-9727249 awarded by the National Science Foundation of the U.S.

TECHNICAL FIELD

The present invention is generally related to a method and composition for removing photoresist and, more particularly, is related to a method and composition of removing photoresist from a silicon substrate using relatively nontoxic and noncorrosive materials.

BACKGROUND OF THE INVENTION

The continuous reduction of dimensions in microelectronic devices and integrated circuits results in more stringent requirements for acceptable levels of various contamination and organic residues on the wafer surface. New device generations lead to the use of new materials and increased number of process steps. There has been a drive in recent years to reduce the use of the enormous volume of de-ionized water used in wafer rinsing steps in order to minimize the cost-of-ownership. Cleaning methods, such as the RCA clean or Pihranna etch techniques attempt to accomplish removal with aqueous phase chemistry. The RCA technique uses baths of hydrogen peroxide/ammonium hydroxide/de-ionized water and hydrogen peroxide/hydrochloric acid/de-ionized water and de-ionized water rinses to clean surfaces. However, this technique and others have various limitations; specifically, they are not compatible with vacuum transfer, they have difficulty removing high dose ion implanted photoresist, and they produce toxic and corrosive waste.

The photoresist stripping process can be costly as well as a source of various production problems such as contamination and device layer damage. For photoresist and ion implanted photoresist removal there are two main technologies, plasma treatment and liquid stripping techniques. Plasma treatments utilize glow discharges that typically contain oxygen, hydrogen, and fluorine and operate at temperatures above 100° C. to maximize reactivity. In contrast, liquid stripping techniques make use of solvents or aqueous phase strippers. Solvents often remove material through a dissolution mechanism. Aqueous phase strippers are water-based with various chemicals added to increase chemical reactivity and solution strength to achieve dissolution and degradation of the photoresist.

Currently, plasma ashing of photoresist using downstream based plasmas has received allot of attention mainly due to the high stripping rates (1–2.9 $\mu$m/min) that can be achieved by this method. Some of the ashing methods used include barrel ashers, microwave plasmas and RIE configurations. However, this method is very expensive and can cause damage to film surfaces and devices because high-energy particles impact the wafer surface. Another problem that is often encountered in plasma stripping is that plasma exposure might make photoresist residues harder to remove. In addition, plasma ashing can cause metal (e.g., iron) and alkali ion (e.g., sodium and potassium) contamination that results in reduced device lifetimes, reduced reliability, and threshold shifts. The source of these contaminants is frequently the photoresist material.

Wet stripping methods that use organic solvents and reactive aqueous strippers are the most common method of stripping in front end of line (FEOL) processes. As in the case of dry resist stripping, there are drawbacks associated with wet stripping. For instance, stripping solutions are generally toxic and corrosive, which results in high disposal and handling costs. Even the addition of ozone to aqueous baths, which has been used to remove resist material (Kashkoush et al., *Materials Research Society Symposium Proceedings*, Vol 477, 1997, p. 173.), can result in toxicity concerns. (Crowl and Louvar, *Chemical Process Safety: Fundamentals with Applications*, Prentice Hall, 1990, pp. 42–44). Often, a residual layer remains on the wafer surface, which may require extra steps to rinse the surface. Stripping solutions also lose potency with time and accumulated contamination in the solutions can be a source of contaminating particles. Another method of stripping photoresist uses acetone, a liquid that often has high levels of impurities. Some stripping processes under investigation use de-ionized water with isopropyl alcohol and potassium fluoride additions. (Ojina et al., *Journal of Electrochemical Society*, Vol. 144, 1997, p. 4005) However, the use of stripping methods using potassium fluoride makes the waste solution disposal costly and more difficult. All of the above stripping methods result in waste streams, which require careful and often costly disposal methods.

Thus, a heretofore unaddressed need exists in the industry to address the aforementioned deficiencies and inadequacies.

SUMMARY OF THE INVENTION

One embodiment of the present invention is a liquid cleaning composition for removal of photoresist including an aliphatic alcohol. Generally, the alcohol is of low-molecular weight and contains fewer than six carbon atoms. Preferably, the alcohol is isopropyl alcohol. The temperature conditions for using the present invention are generally less than about 100 degrees C. The pressure conditions for using the present invention are generally less than about 100 pounds per square inch.

Another embodiment of the present invention is a liquid cleaning composition for removal of photoresist including an aliphatic alcohol and an aqueous base. Generally, the alcohol is of low-molecular weight and contains fewer than six carbon atoms. Preferably, the alcohol is isopropyl alcohol, while the aqueous base is ammonium hydroxide. The temperature conditions for using the present invention are generally less than about 100 degrees C. The pressure conditions for using the present invention are generally less than about 100 pounds per square inch.

A further embodiment of the present invention is a method for the removal of photoresist from a substrate. A layer of photoresist is put upon a substrate. Then the coated substrate is exposed to an aliphatic alcohol. Generally, the alcohol is of low-molecular weight and contains fewer than six carbon atoms. Preferably, the alcohol is isopropyl alcohol. The temperature conditions for using the present invention are generally less than about 100 degrees C. The pressure conditions for using the present invention are generally less than about 100 pounds per square inch.

Still a further embodiment of the present invention is a method for the removal of photoresist from a substrate. A layer of photoresist is put upon a substrate. Then the coated substrate is exposed to an aliphatic alcohol/aqueous base mixture. Generally, the alcohol is of low-molecular weight and contains fewer than six carbon atoms. Preferably, the alcohol is isopropyl alcohol, while the aqueous base is ammonium alcohol. The temperature conditions for using the present invention are generally less than about 100 degrees C. The pressure conditions for using the present invention are generally less than about 100 pounds per square inch.

Other systems, methods, features, and advantages of the present invention are or will become apparent to one with skill in the art upon examination of the following drawings and detailed description. It is intended that all such additional systems, methods, features, and advantages be included within this description, be within the scope of the present invention, and be protected by the accompanying claims.

BRIEF DESCRIPTION OF THE DRAWINGS

The invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

DETAILED DESCRIPTION OF THE PREFERRED EMBODIMENT

The 'RCA clean' is the standard for cleaning microelectronic devices by which all other cleaning methods are measured. As described earlier, the first RCA step uses a hydrogen peroxide/ammonium hydroxide solution in a large quantity of de-ionized water to lightly etch silicon and silicon dioxide layers. Also, widely used in the industry are low molecular weight alcohols (e.g. ethanol, isopropanol, n-propanol) as drying agents in semiconductor processing. Isopropyl alcohol (IPA) rinsing and IPA vapor drying methods have become an integral part of cleaning technology in the semiconductor industry. IPA drying results in the elimination of residual moisture and watermarks on the silicon wafer, removes particles, prevents buildup of static charge, and can eliminate water trapped in deep trenches. However, there are no inventions that use liquid alcohol or a liquid alcohol/base mixture to remove photoresist from silicon substrates. In contrast, two embodiments of the present invention use liquid alcohol to remove photoresist, while two embodiments use an alcohol/base mixture to remove photoresist.

One embodiment of the present invention is a composition including an alcohol, preferably isopropyl alcohol, to clean photoresist off substrates. Another embodiment of the present invention is a method for cleaning substrates using an alcohol. A further embodiment of the present invention is a composition including an alcohol and a base to clean photoresist off substrates. Preferably, the alcohol is isopropyl alcohol and the base is ammonium hydroxide. An additional embodiment of the present invention is a method for cleaning substrates using an alcohol and a base. Preferably, the alcohol is isopropyl alcohol and the base is ammonium hydroxide.

This invention has advantages over other cleaning compositions and methods. The aforementioned compositions and methods lead to the elimination of process steps because separate rinsing and drying steps are not needed. In addition, the alcohol and alcohol/base mixtures are compatible with cluster tool concepts and vacuum technology, thereby allowing process of the substrate without exposing the substrate to atmospheric contaminants. The chemicals used in this invention are of low toxicity with minimal environmental impact, while not costing more than chemicals/processes used in other cleaning methods. The final carbon concentration on surfaces after photoresist stripping with some of the alcohols is comparable to carbon concentrations observed after these surfaces are cleaned by the RCA process.

Before describing the various embodiments, the process of how the photoresist is likely removed and an example of an apparatus that can use the aforementioned compositions and methods will be described.

Figure 1A:
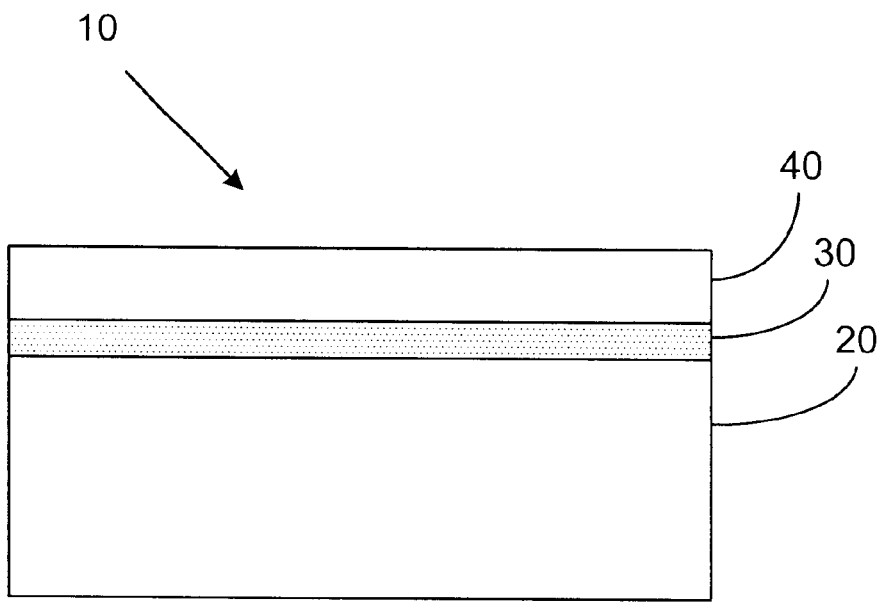
FIG. 1A is a cross sectional view of a silicon dioxide ($SiO_2$) substrate coated with hexamethyldisilazane (HMDS) and photoresist.
Figure 1B:
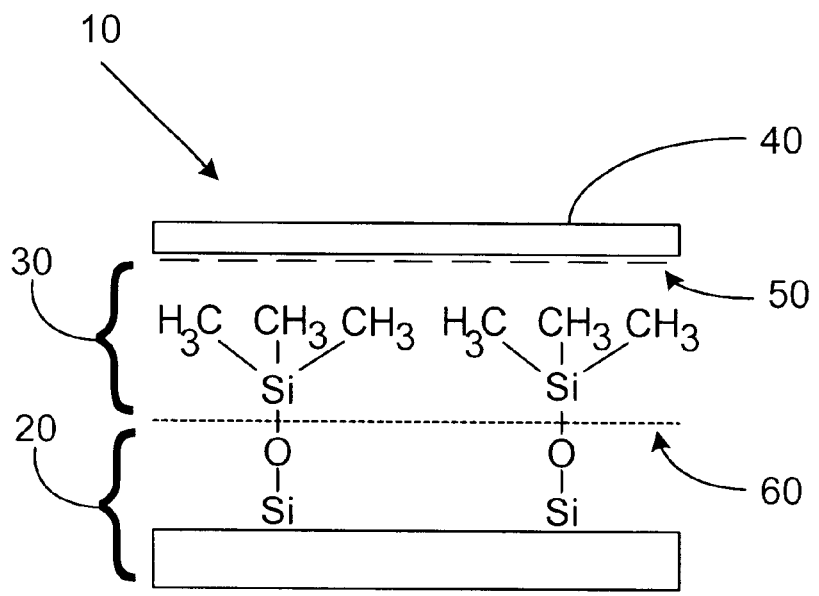
FIG. 1B is a cross sectional view of a coated silicon dioxide substrate showing the molecular interactions of the $SiO_2$, HMDS, and photoresist.

FIG. 1A shows a block diagram of a coated silicon substrate 10. The substrate 20 may be silicon with native silicon dioxide, a thermally grown silicon dioxide film, or a deposited silicon dioxide film. The substrate 20 is initially coated with hexamethyldisilazane (HMDS) 30, which acts as adhesive or a way of enhancing adhesion of the photoresist 40 to the oxide covered substrate 20. In addition, ion implantation may be employed to accurately incorporate impurities into the silicon substrate 10, which may harden the photoresist surface. Furthermore, substrates 10 with aluminum films or patterns may be used. FIG. 1B shows one possible way in which the substrate 20 with a silicon dioxide layer, HMDS 30, and photoresist 40 are molecularly connected or bonded. It has been suggested that the silicon dioxide molecules 20 are bonded to HMDS molecules 30 at a hydrophilic interface 60, while the photoresist molecules 40 are bonded to the HMDS molecules at a hydrophobic interface 50. In other words, if the HMDS 30 and the photoresist 40 were removed completely from the silicon dioxide substrate 20 under ultrahigh vacuum conditions, the silicon dioxide substrate 20 surface 60 would be hydrophilic in nature. In contrast, if only the photoresist 40 were removed from the silicon dioxide 20 and HMDS 30, the surface 50 would be hydrophobic in nature. Accordingly, water would "bead up" on the hydrophobic surface 50, while it would "spread out" on a hydrophilic surface 60.

A qualitative measure, called contact angle, is obtained by measuring the angle of a water-droplet in contact with a surface. The interface between the water drop and the surface can be described as the point where the water molecules are in contact with the surface molecules. The contact angle for water droplets on a hydrophobic surface 50 would be about 90 degrees, while the contact angle for water droplets on a completely hydrophilic surface 60 would be about 5 degrees. Thus, measuring the contact angle can provide qualitative information regarding whether a surface is hydrophobic or hydrophilic in nature.

An apparatus that can be used with the present invention is, preferably, a high pressure/ultrahigh vacuum apparatus (HP/UHV) that has been described in detail by Bakker and Hess, *Review of Scientific Instrumentation,* Vol. 68, 1997, p. 184, which is herein incorporated by reference. Thus, to simplify the figures only minimal detail is shown. Components that are not shown in FIGS. 2 and 3 include, among other things, the vacuum and high-pressure system and the liquid/gas manifold.

Figure 2:
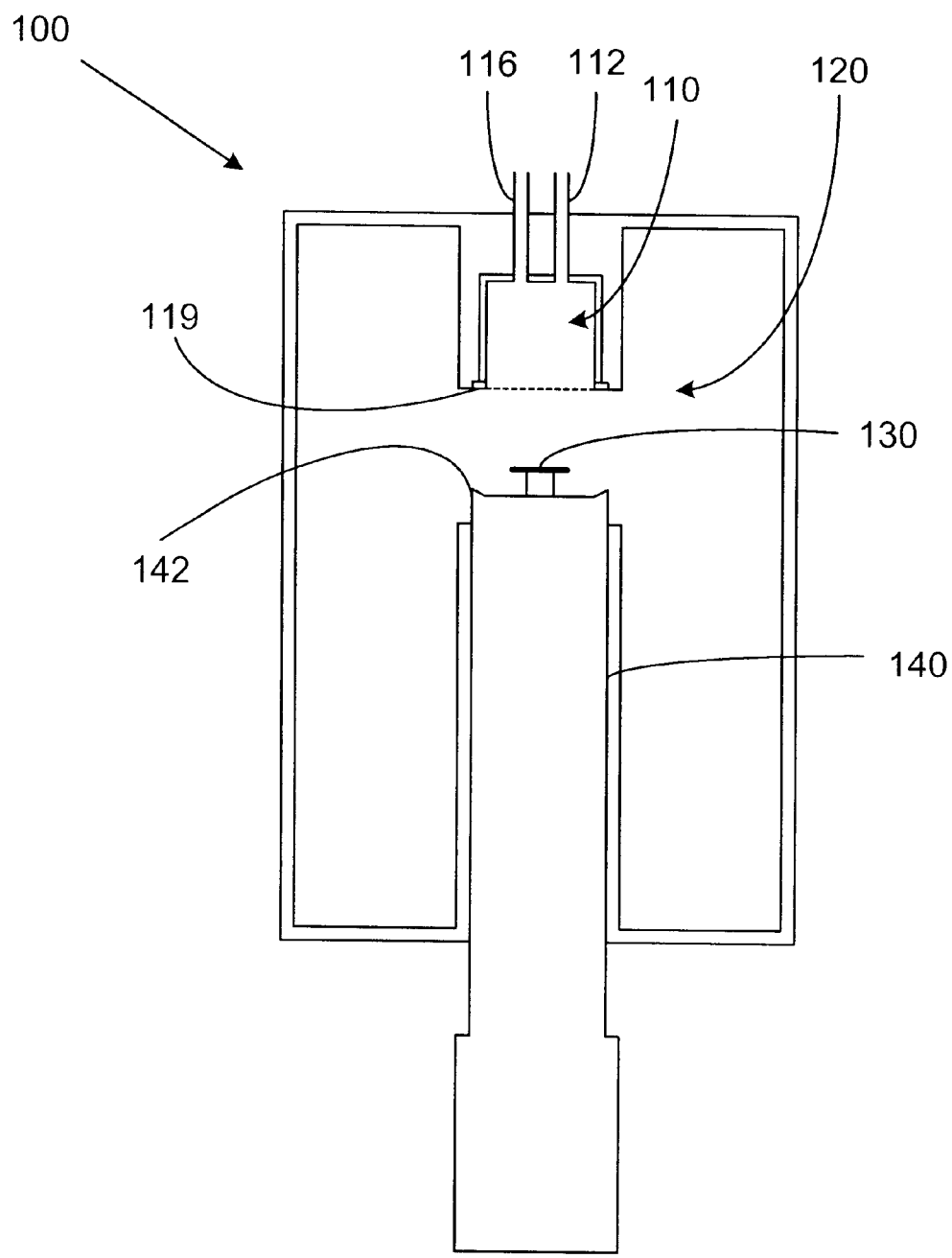
FIG. 2 is a cross sectional view of the high pressure/ultrahigh vacuum (HP/UHV) apparatus used to remove photoresist from substrates with the substrate under an ultrahigh vacuum.

FIG. 2 shows a HP/UHV apparatus 100, which has a cylindrical high-pressure chamber 110 and an ultrahigh vacuum chamber 120. The high-pressure chamber 110 is open to the ultrahigh vacuum chamber 120 as illustrated by the dashed lines in FIG. 2. When assembled, the high-pressure chamber 110 is sealed off from the ultrahigh vacuum chamber 120. Fluid/gas can be flowed into the high-pressure chamber 110 through a plurality of ports 112 and 116, typically composed of stainless steal. For illustrative purposes, port 112 is the entrance port while port 116 is the exit port. However, it should be obvious to one skilled in the art that any number of ports can be connected to the high-pressure chamber 110.

Figure 3:
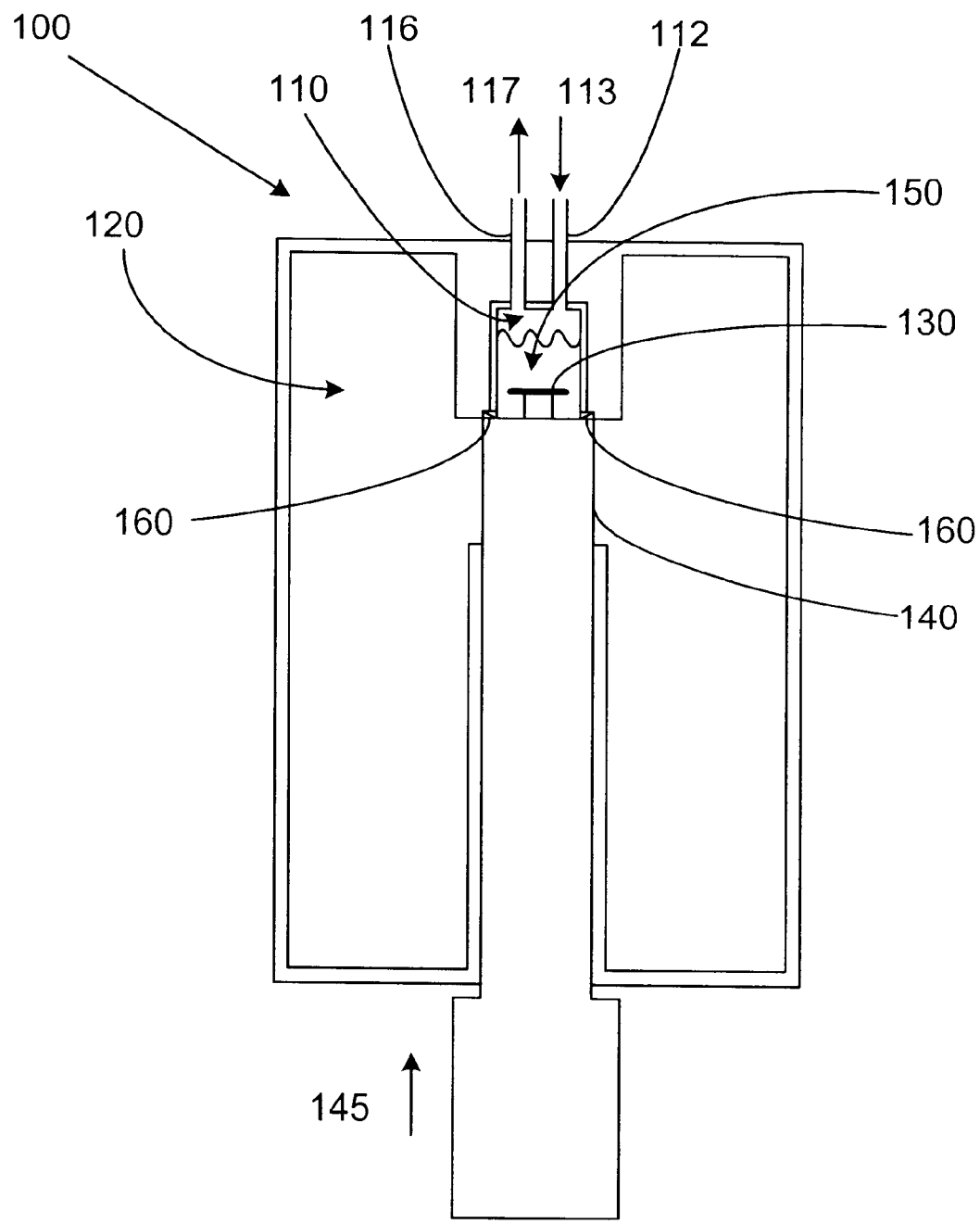
FIG. 3 is a cross sectional view of the high pressure/ultrahigh vacuum apparatus used to remove photoresist from substrates with the substrate within the high pressure chamber.

The coated substrate 130 rests upon the cylindrical thrusting rod 140, which can be moved forward into the high-pressure chamber 110, FIG. 3. The thrusting rod 140 has a knife-edge 142 that cuts into a removable gasket 119 located in a gasket groove on the high-pressure chamber 110 to create a high-pressure seal 160. Once the coated substrate 130 is sealed in the high-pressure source, liquids/gases (hereinafter reagents 150) can be flowed into the high-pressure chamber 110 through one or more ports, as represented by arrow 113. The reagents 150 that are put into the high-pressure chamber 110 interact with the coated silicon substrate 130 under experimental temperature and pressure conditions. After sufficient time has elapsed, the reagents 150 can be pumped out of the high-pressure chamber 110 through one or more ports, as represented by arrow 117. After the pressure in the high-pressure chamber 110 is pumped below a threshold pressure, the thrusting rod 140 and the silicon substrate 130 can pulled out of the high-pressure chamber 110. Further analysis of the silicon substrate 130 can be conducted at this point as described by Bakker and Hess.

As discussed above one embodiment of the present invention is a cleaning composition including an aliphatic alcohol that removes photoresist from a substrate. The alcohols generally are ones with low molecular weight and contain six or fewer carbon atoms. Alcohols of the present invention include, among others, ethanol, isopropyl alcohol, n-propanol, and 2-butanol. Preferably, isopropyl alcohol is the aliphatic alcohol used to remove photoresist from a substrate.

Additionally, another embodiment of the invention involves a method of removing photoresist from a substrate that includes depositing a layer of photoresist onto the substrate and then exposing the coated substrate to an aliphatic alcohol. The alcohols are generally of low molecular weight and contain six or fewer carbon atoms. Alcohols of the present invention include, but are not limited to, ethyl alcohol, isopropyl alcohol, n-propyl alcohol, and n-butyl alcohol. Preferably, isopropyl alcohol is the aliphatic alcohol used to remove photoresist from a substrate. Table 1 describes some of the results obtained using the herein above named alcohols.

TABLE 1

Comparison Table of Photoresist Removal

| Solvent Used | Treatment Time (minutes) | Post Exposure: Atomic % Carbon |
| --- | --- | --- |
| Untreated Photoresist | 0 | 83.7 |
| RCA Clean | 30 | 7.0 |
| Ethyl Alcohol | 3 | 16.2 |
| n-Propyl Alcohol | 6 | 12.5 |
| Isopropyl Alcohol | 7 | 7.4 |
| 2-Butyl Alcohol | 9 | 17.8 |

The two embodiments listed above, both the composition and the method, use the same temperature and pressure profiles. The temperature conditions used for removing photoresist from a substrate are generally less than 100 degrees C. Preferably, the temperature range is about 25 degrees to about 65 degrees C. The pressure conditions used for removing photoresist are generally less than 100 pounds per square inch. Preferably, the pressure range is about 14 pounds per square inch to about 100 pounds per square inch, but up to 500 pounds per square inch has been used.

As discussed above, another embodiment of the present invention is a cleaning composition including an aliphatic alcohol and an aqueous base that removes photoresist from a substrate. The alcohols are generally of low molecular weight and contain six or fewer carbon atoms. Alcohols of the present invention include, but are not limited to, ethanol, isopropyl alcohol, n-propanol, and 2-butanol. Preferably, isopropyl alcohol is the aliphatic alcohol used to remove photoresist from a substrate. The amount of aliphatic alcohol that can be used is in the range of about 80% to about 100% by weight of the alcohol, based on the total weight of the cleaning composition. The base includes ammonium hydroxide that can be used in the range of about 0.1% to about 15% by weight of the base, based on the total weight of the cleaning composition. Additionally, deionized water can be added to the cleaning composition. The amount of deionized water that can be used is in the range of about 0% to about 10% by weight of the water, based on the total weight of the cleaning composition.

Additionally, another embodiment of the invention involves a method of removing photoresist from a substrate that includes depositing a layer of photoresist onto the substrate and then exposing the coated substrate to an aliphatic alcohol and an aqueous base. The alcohols are generally of low molecular weight and contain six or fewer carbon atoms. Alcohols of the present invention include, among others, ethanol, isopropyl alcohol, n-propanol, and 2-butanol. Preferably, isopropyl alcohol is the aliphatic alcohol used to remove photoresist from a substrate. The amount of aliphatic alcohol that can be used is in the range of about 80% to about 100% by weight of the alcohol, based on the total weight of the cleaning composition. The base includes ammonium hydroxide that can be used in the range of about 0.1% to about 15% by weight of the base, based on the total weight of the cleaning composition. Additionally, de-ionized water can be added to the cleaning composition. The amount of deionized water that can be used is in the range of about 0% to about 10% by weight of the water, based on the total weight of the cleaning composition.

The last two embodiments listed above, composition and method, use the same temperature and pressure profiles. The temperature conditions used for removing photoresist from a substrate are generally less than 100 degrees C. Preferably, the temperature range is about 25 degrees to about 70 degrees C. The pressure conditions used for removing photoresist are generally less than 100 pounds per square inch. Preferably, the pressure range is about 14 pounds per square inch to about 100 pounds per square inch, but up to 500 pounds per square inch has been used.

EXAMPLE 1

A. Silicon substrates or wafers, generally of 4-inch diameter, were coated with Shipley 1813 positive photoresist. The photoresist thickness, measured by profilometry, was approximately 1 $\mu$m. Before the photoresist was spun onto a silicon substrate, a primer, hexamethyldisilazane (HMDS), was applied to the surface of the substrates for improved adhesion. Then the substrate was soft baked at about 90° C. for about fifteen minutes and hard baked at about 120° C. for about thirty minutes in an oven. Samples of size 1 cm×1 cm were cut using a diamond scribe, and were placed in an isopropyl alcohol (IPA) bath at room temperature (about 27° C.) and atmospheric pressure. Visually, all photoresist disappeared after two minutes. However, use of a 90% IPA and 10% water mixture increases the stripping time to more than seven minutes. Removal of the samples from the bath at thirty-second intervals indicated that the IPA likely removes the photoresist by dissolution along with formation of bubbles and crazing. Observation of the samples under 40×magnification did not show any residual resist on the substrate surfaces. Atomic force microscopy (AFM) images of the sample in comparison to a control sample which did not have photoresist, but was immersed in IPA, showed an increase of about 1.2 nm in roughness, indicating that a thin resist layer (<0.02 $\mu$m) remained on the substrates. This assumption was confirmed by comparison of the x-ray photoelectron spectroscopy (XPS) spectrum of the substrate from which the photoresist had been stripped by IPA, with a silicon substrate with only native oxide. The silicon substrate was treated with IPA for the same amount of time at the same temperature and pressure as the resist-covered substrate. The sample with resist that was exposed to an IPA treatment showed a more intense carbon peak in the XPS spectrum, indicating that some residual photoresist remained after the IPA treatment.

The average rate of resist removal was measured to be 0.25±0.1 $\mu$m/min. Initially, the removal rate was high (0.6±0.1 $\mu$m/min), but the rate decreased with decreasing photoresist thickness. One possible explanation for this rate is that the decrease may be due to the decrease in dissolution efficiency of the IPA; that is, the IPA might have become saturated with the photoresist. In addition, it is known that IPA swells photoresist. Thus, a possible explanation for the high initial removal rate is that the IPA swells the upper portion of the photoresist, thereby enhancing the removal rate. However, the rate decreases for the portion of the resist closest to the surface of the substrate, where adhesion inhibits swelling.

XPS studies of silicon substrates treated with IPA showed a marked decrease in carbon content relative to silicon substrates that had been exposed to the atmosphere. This indicates that IPA is capable of removing adventitious carbon. In addition, AFM studies of the above two samples did not show an appreciable increase in surface roughness of the IPA-treated sample. This may suggest that the application of the IPA solution does not roughen the silicon substrate.

B. Additionally, experiments were performed to observe the effect of water on the photoresist stripping ability of IPA. IPA and water mixtures containing up to 50% by volume of IPA do not attack the photoresist. Although a 70% IPA and water mixture attacks photoresist, the stripping rate was very low.

C. Further, experiments were also performed to determine whether IPA attacks films of aluminum or silicon dioxide. Silicon substrates (1 cm×1 cm) with about a 3 $\mu$m thick thermally grown silicon dioxide layer were treated with IPA at room temperature and atmospheric pressure for up to ten minutes. AFM images of the treated samples did not show any changes in the surface roughness. Analogous experiments were performed on silicon samples with a 3 $\mu$m Al layer deposited by evaporation. Again, the AFM images did not show any increase in surface roughness, which suggests that IPA would work on this surface as well.

D. Ion implantation is used extensively for accurate control of impurity incorporation in semiconductor substrates. The process generally uses a photoresist mask for selective area ion implants, which hardens the photoresist surface. The high ion dose and high ion energy used during the implant result in the formation of a carbonized "crust" that makes photoresist stripping very difficult. This toughened resist is removed either by plasma stripping, by using various strong organic solvents, or ozonated chemistries at elevated temperatures. The disadvantages associated with such approaches have already been discussed.

Experiments were performed to determine the ability of IPA to remove ion-implanted photoresist. Samples were prepared by ion implantation of a patterned resist with a high dose of As (1E16 ion/cm$^2$). At room temperature and atmospheric pressure, IPA did not attack the toughened resist. The samples were than immersed in IPA at 90 degrees C. and 500 pounds per square inch. The samples were removed after 10 minutes of immersion. Microscopic observation of the samples indicates that the resist was removed at various places on the resist surface.

Ion implanted resist samples were placed in a bath of IPA on a hot plate. The temperature was adjusted to 65 degrees C. The ion-implanted photoresist was removed in ten minutes. During the treatment, pieces of photoresist were observed in the IPA bath. One explanation that may explain such results may be that in the case of ion implanted photoresist, the removal mechanism, at least partly, involves film peeling rather then complete dissolution.

EXPERIMENT 2

A. Silicon substrates or wafers (4-inch diameter) were primed with HMDS to improve adhesion to the photoresist film. Subsequently, these substrates were coated with Shipley 1813 positive photoresist. The photoresist thickness, measured by profilometry, was 1 $\mu$m. The substrate was soft baked at 90 degrees C. for two minutes on a hot plate and the photoresist was patterned and developed. The post-development hard bake was done at 120 degrees C. for two minutes on a hotplate. Samples of size 1 cm×1 cm were cut using a diamond scribe and placed in specific solution baths. Two different solutions were used to remove the photoresist. The first solution contained 5% ammonium hydroxide (30% ammonia in water solution) in 95% isopropyl alcohol. Although the carbon concentration drops to 17 atomic % carbon in seven minutes at a temperature of 27 degrees C., the contact angle remains around 60 degrees. Increasing the temperature to 50 degrees C. decreases the post-treated contact angle of the surface to 42 degrees.

B. The second solution contained 5% ammonium hydroxide (30% ammonia in water solution) along with 5% de-ionized water in 90% alcohol. The presence of water results in higher dissociation of ammonium hydroxide, due to the higher dielectric constant of water compared to that of isopropyl alcohol. This solution removes the 1.0 $\mu$m photoresist layer in three minutes with a final carbon concentration of 7–8 atomic % carbon. The contact angles on the post treated surface are 28±2 degrees at room temperature and 20±1 degrees at 50 degrees C. One possible explanation of the low carbon concentration along with the decrease in contact angle suggests that photoresist is being removed from the surface by the dual mechanism of dissolution and physical lift off. More particularly, the alcohol dissolves the photoresist, which is only held to the surface by van der Waals forces. The hydroxyl ions produced from the ammonium hydroxide breaks the Si—O—Si bond to remove the HMDS layer from the surface, exposing fresh silicon dioxide. The presence of a certain amount of water enables sufficient hydroxyl ions from ammonium hydroxide to attack the bonds at the Si-HMDS interface.

C. Ion implantation is used extensively for accurate control of impurity incorporation into semiconductor substrates. The process generally uses a photoresist mask for selective area ion implants, and the implantation process hardens the photoresist surface. The high ion dose and high ion energy used during the implant results in the formation of a carbonized "crust" that makes resist stripping very difficult. This toughened resist is removed primarily by plasma ashing followed by sulfuric acid/hydrogen peroxide (SPM) rinse.

Shipley 1813 photoresist was implanted with boron and phosphorous ions. The implant doses were $10^{+12}$ atoms/cm$^2$ and $10^{+15}$ atoms/cm$^2$, respectively. The second solution is able to strip the resist with lower implant dose in about seven minutes at room temperature and three minutes at 50 degrees C. The samples with higher implant dose takes about twenty to about forty five minutes to be completely removed depending on the alcohol used in the mixture. An ammonium hydroxide mixture containing ethanol requires about seven minutes at 50 degrees C. and twenty minutes at room temperature respectively, while longer exposure time is needed for isopropyl alcohol. Typically, patterned resists require several minutes longer exposure to the cleaning solvents to be completely removed.

It should be emphasized that the above-described embodiments of the present invention, particularly, any "preferred" embodiments, are merely possible examples of implementations, merely set forth for a clear understanding of the principles of the invention. Many variations and modifications may be made to the above-described embodiment(s) of the invention without departing substantially from the spirit and principles of the invention. All such modifications and variations are intended to be included herein within the scope of this disclosure and the present invention and protected by the following claims.

Therefore, having thus described the invention, at least the following is claimed:

1. A method for the removal of photoresist from a substrate comprising:
   depositing a layer of photoresist on a substrate; and
   exposing said photoresist to a composition wherein said composition comprises an aliphatic alcohol, an aqueous base, and de-ionized water.

2. The method of claim 1, wherein said cleaning composition is under temperature conditions of less than about 100 degrees C.

3. The method of claim 1, wherein said cleaning composition is under temperature conditions in the range of about 25 degrees C. to about 70 degrees C.

4. The method of claim 1, wherein said cleaning composition is under pressure conditions less than 100 pounds per square inch.

5. The method of claim 1, wherein said cleaning composition is under pressure conditions in the range of about 14 pounds per square inch to about 100 pounds per square inch.

6. The method of claim 1, wherein said aliphatic alcohol comprises a low-molecular weight aliphatic alcohol of fewer than six carbon atoms.

7. The method of claim 1, wherein said aliphatic alcohol comprises isopropyl alcohol.

8. The method of claim 7, wherein said isopropyl alcohol is about 80% to about 100% by weight of the total weight of the cleaning composition.

9. The method of claim 1, wherein said aqueous base comprises ammonium hydroxide.

10. The method of claim 9, wherein said ammonium hydroxide is about 0.1% to 15% by weight of the total weight of the cleaning composition.

11. The method of claim 1, wherein said de-ionized water is about 0.1% to about 10% by weight of the total weight of the cleaning composition.

12. A method for the removal of photoresist from a substrate comprising
   depositing a layer of photoresist on a substrate; and
   exposing said photoresist to a composition wherein said composition comprises:
      an aliphatic alcohol, wherein said aliphatic alcohol comprises isopropyl alcohol; and
      an aqueous base, wherein said base comprises ammonium hydroxide, wherein said aliphatic alcohol and said base are under temperature conditions in the range of about 25 degrees C. to about 70 degrees C. and under pressure conditions in the range of about 14 pounds per square inch to about 100 pounds per square inch.

13. A method for the removal of photoresist from a substrate comprising:
   providing a substrate with a layer of photoresist disposed thereon; and
   exposing said photoresist to a composition, wherein said composition comprises an aliphatic alcohol and ammonium hydroxide.

14. The method of claim 13, wherein said cleaning composition is under temperature conditions of less than about 100 degrees C.

15. The method of claim 13, wherein said cleaning composition is under temperature conditions in the range of about 25 degrees C. to about 70 degrees C.

16. The method of claim 13, wherein said cleaning composition is under pressure conditions less than 100 pounds per square inch.

17. The method of claim 13, wherein said cleaning composition is under pressure conditions in the range of about 14 pounds per square inch to about 100 pounds per square inch.

18. The method of claim 13, wherein said aliphatic alcohol comprises a low-molecular weight aliphatic alcohol of fewer than six carbon atoms.

19. The method of claim 13, wherein said aliphatic alcohol comprises isopropyl alcohol.

20. The method of claim 13, wherein said isopropyl alcohol is about 80% to about 100% by weight of aliphatic alcohol, based on the total weight of the cleaning composition.

21. The method of claim 13, wherein said ammonium hydroxide is about 0.1% to 15% by weight of the total weight of the cleaning composition.

22. The method of claim 13, wherein said cleaning composition comprises de-ionized water.

23. The method of claim 22, wherein said de-ionized water is about 0.1% to about 10% by weight of the total weight of the cleaning composition.

24. A method for the removal of photoresist from a substrate comprising:

providing a substrate with a layer of photoresist disposed thereon; and exposing said photoresist to a composition wherein said composition comprises an aliphatic alcohol, an aqueous base, and de-ionized water.

25. The method of claim 24, wherein said cleaning composition is under temperature conditions of less than about 100 degrees C.

26. The method of claim 24, wherein said cleaning composition is under temperature conditions in the range of about 25 degrees C. to about 70 degrees C.

27. The method of claim 24, wherein said cleaning composition is under pressure conditions less than 100 pounds per square inch.

28. The method of claim 24, wherein said cleaning composition is under pressure conditions in the range of about 14 pounds per square inch to about 100 pounds per square inch.

29. The method of claim 24, wherein said aliphatic alcohol comprises a low-molecular weight aliphatic alcohol of fewer than six carbon atoms.

30. The method of claim 24, wherein said aliphatic alcohol comprises isopropyl alcohol.

31. The method of claim 30, wherein said isopropyl alcohol is about 80% to about 100% by weight of the total weight of the cleaning composition.

32. The method of claim 24, wherein said aqueous base comprises ammonium hydroxide.

33. The method of claim 32, wherein said ammonium hydroxide is about 0.1% to 15% by weight of the total weight of the cleaning composition.

34. A method for the removal of photoresist from a substrate comprising:

providing a substrate having a layer of photoresist disposed thereon; and exposing said photoresist to a composition wherein said composition consisting essentially of an aliphatic alcohol and an aqueous base.

35. The method of claim 34, wherein said cleaning composition is under temperature conditions of less than about 100 degrees C.

36. The method of claim 34, wherein said cleaning composition is under temperature conditions in the range of about 25 degrees C. to about 70 degrees C.

37. The method of claim 34, wherein said cleaning composition is under pressure conditions less than 100 pounds per square inch.

38. The method of claim 34, wherein said cleaning composition is under pressure conditions in the range of about 14 pounds per square inch to about 100 pounds per square inch.

39. The method of claim 34, wherein said aliphatic alcohol comprises a low-molecular weight aliphatic alcohol of fewer than six carbon atoms.

40. The method of claim 34, wherein said aliphatic alcohol comprises isopropyl alcohol.

41. The method of claim 40, wherein said isopropyl alcohol is about 80% to about 100% by weight of aliphatic alcohol, based on the total weight of the cleaning composition.

42. The method of claim 34, wherein said aqueous base comprises ammonium hydroxide.

43. The method of claim 42, wherein said ammonium hydroxide is about 0.1% to 15% by weight of the total weight of the cleaning composition.

44. The method of claim 34, wherein said cleaning composition comprises de-ionized water.

45. The method of claim 44, wherein said de-ionized water is about 0.1% to about 10% by weight of the total weight of the cleaning composition.

* * * * *